(12) United States Patent
Sidhu et al.

(10) Patent No.: US 8,250,751 B2
(45) Date of Patent: Aug. 28, 2012

(54) METHOD OF MANUFACTURING A PRINTED CIRCUIT BOARD

(75) Inventors: Rajwant Sidhu, Brea, CA (US); Paul Walker, Yorba Linda, CA (US)

(73) Assignee: DDi Global Corp., Anaheim, CA (US)

( * ) Notice: Subject to any disclaimer, the term of this patent is extended or adjusted under 35 U.S.C. 154(b) by 1147 days.

(21) Appl. No.: 12/070,811

(22) Filed: Feb. 20, 2008

(65) Prior Publication Data

US 2008/0196935 A1    Aug. 21, 2008

Related U.S. Application Data

(60) Provisional application No. 60/902,545, filed on Feb. 20, 2007.

(51) Int. Cl.
*H01K 3/10* (2006.01)
(52) U.S. Cl. .............. 29/852; 29/847; 29/832; 174/262
(58) Field of Classification Search .............. 156/150; 174/155, 262, 263; 428/901; 29/830, 831, 29/846, 847, 852
See application file for complete search history.

(56) References Cited

U.S. PATENT DOCUMENTS

| 5,830,374 | A | 11/1998 | Boyko et al. |
| 6,242,078 | B1 * | 6/2001 | Pommer et al. ............. 174/255 |
| 6,409,930 | B1 | 6/2002 | Whitehurst et al. |
| 7,083,901 | B2 * | 8/2006 | Egitto et al. .................. 29/852 |
| 2001/0023830 | A1 | 9/2001 | Inoue et al. |
| 2004/0020690 | A1 | 2/2004 | Parker, Jr. et al. |
| 2004/0134682 | A1 | 7/2004 | En et al. |
| 2006/0029726 | A1 | 2/2006 | Mok et al. |
| 2006/0124583 | A1 | 6/2006 | Kukanskis et al. |
| 2006/0144618 | A1 | 7/2006 | Song et al. |
| 2007/0034519 | A1 | 2/2007 | Chinda et al. |

OTHER PUBLICATIONS

Supplementary European Search Report and Written Opinion for Application No. EP 08 72 5858, dated Apr. 28, 2010, 6 pages.
International Search Report of PCT/Us08/02265 dated May 20, 2008. SIPO Office action, for corresponding Chinese Patent Application No. 200880005688.5, dated Mar. 2, 2011, 4 pages.

(Continued)

*Primary Examiner* — Donghai D. Nguyen
(74) *Attorney, Agent, or Firm* — Christie, Parker & Hale, LLP

(57) ABSTRACT

Printed circuit boards have circuit layers with one or more copper filled through-holes and methods of manufacturing the same. An aspect of an embodiment of the present invention enhances thermal characteristics of filled through-holes of printed circuit boards to provide extra reliability to the printed circuit boards. In one embodiment, a printed circuit broad has a plurality of through-holes to connect copper patterns on different layers of the printed circuits broad. Here, at least one of the through-holes is copper plated closed at both ends with at least 70% volume of the through-hole plated with copper to, e.g., enhance thermal characteristics of the through-hole, thereby providing extra reliability to the printed circuit board. In one embodiment, the printed circuit board includes a surface conductor (or cap) that is directly plated over the copper filled barrel plated through-hole.

9 Claims, 8 Drawing Sheets
(8 of 8 Drawing Sheet(s) Filed in Color)

OTHER PUBLICATIONS

SIPO Office action, with English translation, for corresponding Chinese Patent Application No. 200880005688.5, dated Jul. 27, 2011, 9 pages.

SIPO First Office Action dated Aug. 24, 2010 for Chinese Application No. 200880005688.5, with English Translation, noting listed U.S. references in this IDS, 19 pages.

Extended European Search Report dated Dec. 7, 2011, for European Patent Application No. 11187947.4, listing U.S. Patent Publications 2001/0023830 A1, 2006/0144618 A1, 2006/0029726 A1, and 2007/0034519 A1, all of which were previously cited in an IDS on Jun. 2, 2010, 7 pages.

* cited by examiner

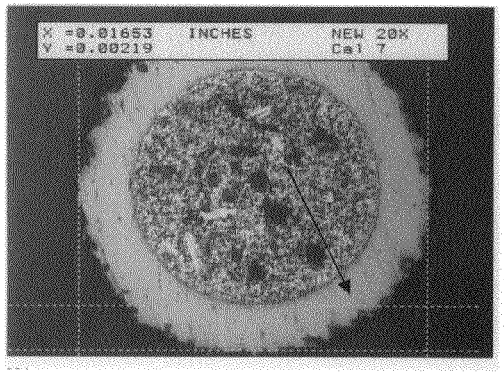
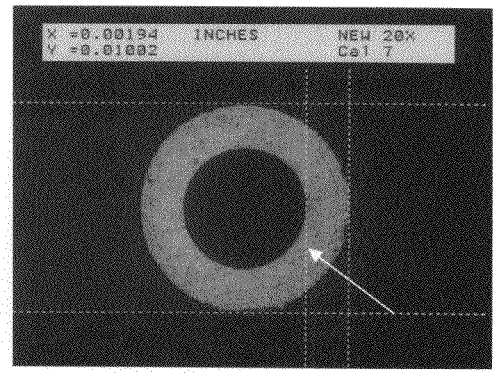
FIGURE 9　　　　　　　　　　FIGURE 10
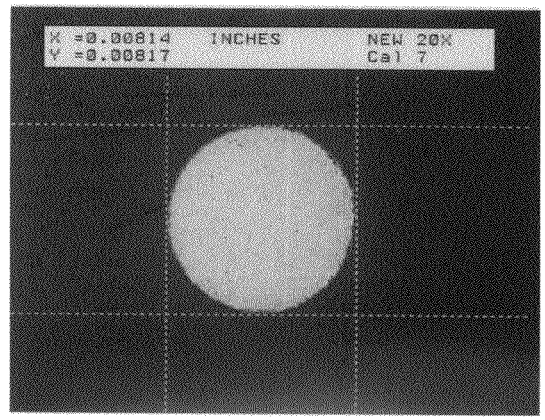
FIGURE 11

METHOD OF MANUFACTURING A PRINTED CIRCUIT BOARD

CROSS-REFERENCE TO RELATED APPLICATION(S)

This application claims priority to and the benefit of U.S. Provisional Application No. 60/902,545, filed on Feb. 20, 2007, the entire content of which is incorporated herein by reference.

BACKGROUND OF THE INVENTION

1. Field of the Invention

The present invention relates to multilayer printed wiring boards with through-holes and methods of manufacturing the same.

2. Description of the Related Art

Most electronic systems include printed wiring (or circuit) boards with high density electronic interconnections. A printed circuit board may include one or more circuit cores, substrates, or carriers. In one fabrication scheme for the printed circuit board having the one or more circuit carriers, electronic circuitries (e.g., pads, electronic interconnects, patterns, etc.) are fabricated onto opposite sides of an individual circuit carrier to form a pair of circuit layers. These circuit layer pairs of the circuit board may then be physically and electronically joined to form the printed circuit board by fabricating an adhesive (or a prepreg or a bond ply), stacking the circuit layer pairs and the adhesives in a press, curing the resulting circuit board structure, mechanically drilling (or laser drilling) through-holes, and then plating the through-holes with a copper material to interconnect the circuit layer pairs.

In some designs requiring high reliability, these printed circuit boards are formed by filling the through-holes with a conductive ink (e.g., CB100, manufactured by DuPont, Inc., or equivalent substitute from different supplier(s)) or a non-conductive ink (e.g., PHP-900, manufactured by San-Ei Kagaku Co. Ltd., or equivalent substitute from different supplier). These ink filled holes are more reliable than non-filled holes because the cured ink plug acts as support to However, reliability problems may still occur with these printed circuit boards having the ink filled holes. These reliability problems typically occur during the component assembly process of the printed circuit boards because this is when the printed circuit boards are exposed to a series of thermal heat excursions. It is during these thermal heat excursions that a conductor on a surface (e.g., a copper plated cap) of a plated through-hole that is filled with ink materials can separate from the electrolytic copper plated hole-wall as shown by the arrows in FIGS. 1A, 1B, 2A, and 2B.

In order to help reduce this separation, IPC (Association Connecting Electronics Industries) introduced some new requirements known as "wraparound plating thickness" (IPC-6012B Amendment 1—December 2006 Qualification and Performance Specification for Rigid Printed Boards). This wraparound copper does help to reduce the occurrence of surface conductor separation from holes with barrel-plated copper as shown in FIGS. 3 and 4.

However, the wraparound plating thickness does not completely eliminate the occurrences of circuit board failures, such as surface conductor separation from holes with barrel-plated copper as shown by the arrows in FIGS. 5 and 6. At the same time, the wraparound plating thickness makes it very difficult and almost impossible to manufacture some of the designs with sequential lamination cycles (e.g., where a sub-component of a circuit board is laminated again more circuit layers or another sub-component of the circuit board) and/or designs with multiple blind via holes that start at a common conductor layer. Each wraparound process increases the surface plated copper by approximately 0.0005". This increase in the surface plated copper reduces the space between traces, limiting the ability to produce fine line conductors on the layers with wrap plating.

Furthermore, the conductive or non-conductive ink filled holes need to be planarized (leveled) after the through-holes are filled with ink and cured. Occasionally, this planarization operation removes the wraparound copper that was previously plated. The printed circuit boards with no wraparound copper are subject to rejection as per IPC-6012B. This condition renders the printed circuit boards susceptible to have the copper plated cap separate from the hole-wall as shown in FIGS. 1 and 2. Unfortunately and as mentioned above, this separation of the cap from the hole-wall may happen during the component assembly process.

SUMMARY OF THE INVENTION

An aspect of an embodiment of the present invention enhances thermal characteristics of through-holes of printed circuit boards to provide extra reliability to the printed circuit boards.

An aspect of an embodiment of the present invention maximizes (or increases) a contact (or bond) surface area between a surface conductor (or cap) and a copper filled through hole.

In an embodiment of the present invention, a printed circuit broad is provided with a plurality of through-holes to connect copper patterns on different layers of the printed circuits broad. Here, at least one of the through-holes is copper plated closed at both ends with at least 70% volume of the through-hole plated with copper to, e.g., enhance thermal characteristics of the through-hole, thereby providing extra reliability to the printed circuit board.

In another embodiment of present invention, a method of manufacturing a printed circuit board having a plurality of circuit layers with through-holes to connect copper patterns on different layers of the printed circuit board is provided. The method includes plate-closing at least one of the through-holes with electrolytic copper plating and then forming a surface conductor (or cap) that directly plates over the copper filled through-hole.

In another embodiment of the present invention, a method of manufacturing a printed circuit board having a plurality of circuit layers with at least one through-hole to connect copper patterns on different layers of the printed circuit board is provided. The method includes laminating the plurality of circuit layers with each other to form the circuit board with a first solid copper layer and a second solid copper layer respectively as both outermost layers of the circuit board, drilling at least one through-hole into the laminated circuit layers, metalizing (e.g., electroless coppering) the drilled circuit layers with the at least one through-hole, applying a resist (e.g., coating a photo resist) on both outermost layers of the circuit layers, and patterning the resist on both outermost layers of the circuit layers to expose the at least one through-hole to an electrolytic plating solution. In addition, the method includes electrolytic copper plating the at least one through-hole with the electrolytic plating solution to plate close the at least one through-hole, removing the resist, planarizing excess copper plated on both outermost layers of the circuit layers, and forming a conductive cap on at least one outermost layer of the circuit layers to cover the copper filled through-hole.

In one embodiment, the at least one through-hole is formed by mechanical drilling.

In one embodiment, the forming the conductive cap to cover the copper filled through-hole includes cleaning the planarized circuit layers with the copper filled through-hole, applying a second resist (e.g., coating a second photo resist) on both outermost layers of the circuit layers with the copper filled through-hole, patterning the second resist on at least one outermost layer of the circuit layers to image the conductive cap on the copper filled through-hole, plating copper directly over the copper filled through-hole to form the conductive cap, removing the second resist, and etching the at least one outermost layer of the circuit layers to form the circuit board.

In one embodiment, the forming the conductive cap to cover the copper filled through-hole includes forming the conductor cap to directly plate over the copper filled through-hole.

In one embodiment, the copper plating the at least one through-hole with the electrolytic plating solution to plate close the at least one through-hole includes barrel plating the at least one through-hole with the electrolytic plating solution to plate close the at least one through-hole.

In one embodiment, the copper plating the at least one through-hole with the electrolytic plating solution to plate close the at least one through-hole includes plating the at least one through-hole with at least 70% volume of the at least one though-hole with copper.

In one embodiment, the copper plating the at least one through-hole with the electrolytic plating solution to plate close the at least one through-hole includes plating the at least one through-hole with enough electrolytic plated copper to plate close both ends of the at least one though-hole.

In one embodiment, the copper plating the at least one through-hole with the electrolytic plating solution to plate close the at least one through-hole includes enhancing a thermal characteristic of the at least one through-hole.

In another embodiment of the present invention, a printed circuit board includes a plurality of circuit layers, each of the plurality of circuit layers having a copper pattern, and at least one copper filled through-hole adapted to connect the copper patterns on different layers of the plurality of circuit layers. Here, the at least one copper filled though-hole is electrolytic copper plated closed at both ends of the at least one copper filled though-hole.

In one embodiment, the printed circuit board further includes a conductive cap adapted to cover the at least one copper filled through-hole.

In one embodiment, the at least one copper filled through-hole is a mechanical drilled through-hole.

In one embodiment, the printed circuit board further includes a conductive cap copper plated directly over the at least one copper filled through-hole.

In one embodiment, the at least one copper filled through-hole is plated close at both ends with at least 70% by volume of the through-hole plated with copper.

In one embodiment, the at least one copper filled through-hole includes a plurality of through-holes electrolytic copper plated closed at both ends with at least 70% volume of the through-holes plated with copper.

In one embodiment, the at least one copper filled through-hole includes a plurality of through-holes, and each of the through-holes is electrolytic copper plated closed at both ends with at least 70% volume of the corresponding through-hole plated with copper.

In one embodiment, the at least one copper filled through-hole is a barrel plated through-hole.

In one embodiment, the at least one copper filled through-hole includes enough electrolytic plated copper to plate close both ends of the at least one copper filled though-hole.

In one embodiment, the at least one copper filled through-hole enhances a thermal characteristic of the printed circuit board.

In one embodiment, the plurality of circuit layers of the printed circuit includes at least two, three or four circuit layers, and the at least one copper filled through-hole passes through the at least two, three, or four circuit layers to connect the copper patterns on different circuit layers.

In one embodiment, the printed circuit board is a sub-component printed circuit board or an entire component printed circuit board.

In another embodiment of the present invention, a method of manufacturing a printed circuit board having a plurality of circuit layers with at least one through-hole to connect copper patterns on different layers of the printed circuit board is provided. The method includes: drilling at least one through-hole into a laminated structure with a first solid copper layer and a second solid copper layer respectively as both outermost layers of the laminated structure; metalizing the drilled circuit layers with the at least one through-hole; applying a resist on both outermost layers of the laminated structure; patterning the resist on both outermost layers of the laminated structure to expose the at least one through-hole to an electrolytic plating solution; electrolytic copper plating the at least one through-hole with the electrolytic plating solution to plate close the at least one through-hole; removing the resist; planarizing excess copper plated on both outermost layers of the laminated structure; and forming a conductive cap on at least one outermost layer of the laminated structure to cover the copper filled through-hole.

BRIEF DESCRIPTION OF THE DRAWINGS

The patent or application file contains at least one drawing/picture executed in color. Copies of this patent or patent application publication with color drawing/picture(s) will be provided by the Office upon request and payment of the necessary fee.

The accompanying drawings, together with the specification, illustrate exemplary embodiments of the present invention, and, together with the description, serve to explain the principles of the present invention.

FIGS. 9 and 10 are views showing examples of the surface copper contact bond area (shown by arrows) having through-holes with conductive (FIG. 9) and non-conductive (FIG. 10) materials.

FIG. 11 is a view showing an embodiment with increased copper-to-copper surface contact bond area when compared with the examples of FIGS. 9 and 10.

DETAILED DESCRIPTION

Figure 1A:
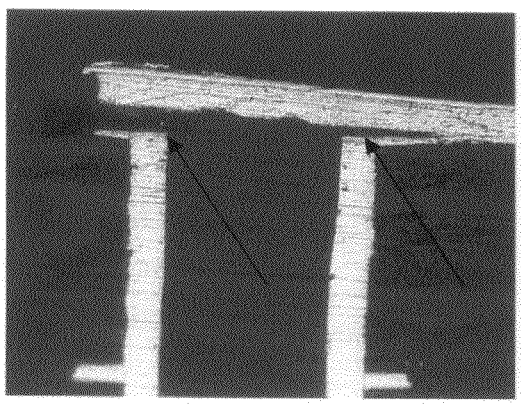
FIGS. 1A, 1B, 2A, and 2B are views showing that a plated through-hole with varying degree of copper wrap plate over the surface copper (e.g., a copper foil at the knee of the through-hole and filled with ink materials) can separate from an electrolytic copper plated hole-wall.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive.

In the context of the present invention, a circuit board refers to a sub-component printed circuit board (e.g., a sub-component of a circuit board) or an entire component printed circuit board (e.g., an entire finished circuit board).

Through-holes are drilled and plated with copper to the minimum required hole wall thickness in the printed circuit boards to connect copper patterns on different layers. In one embodiment, one or more of the through-holes are formed by mechanical drilling. In another embodiment, the one or more of the through-holes are formed by laser drilling. After plating, some non-component through-holes are filled with conductive or non-conductive via fill material. This is done to provide extra reliability and to enhance the one or more thermal characteristics of these holes. An embodiment of the present invention provides an alternative to the conductive or non-conductive ink filled through-holes. This is done to help facilitate the manufacturability and increase the reliability of printed circuit board designs with via fill requirements. In one embodiment of the present invention, through-holes are copper plated closed at both ends with at least 70% volume of the through-holes plated with copper. In another embodiment of the present invention, at least one of the through-holes is copper plated closed at both ends with at least 70% volume of the through-hole plated with copper. In yet another embodiment of the present invention, each of the through-holes is copper plated closed at both ends with at least 70% volume of the corresponding through-hole plated with copper.

In one embodiment of the present invention, a printed circuit board includes one or more circuit cores, substrates, or carriers. In one fabrication scheme for the printed circuit board having the one or more circuit carriers, electronic circuitries (e.g., pads, electronic interconnects, etc.) are fabricated onto opposite sides of an individual circuit carrier to form a pair of circuit layers. These circuit layer pairs of the circuit board may then be physically and electronically joined to form the printed circuit board by fabricating an adhesive (or a prepreg or a bond ply), stacking the circuit layer pairs and the adhesives in a press, curing the resulting circuit board structure, drilling through-holes, and then plating the through-holes with copper, as described in more detail below, to interconnect the circuit layer pairs.

In one embodiment, the printed circuit board includes at least two, three, or four circuit layers. In one embodiment, the printed circuit board includes at least five circuit layers. In one embodiment, the printed circuit board includes at least six circuit layers. In one embodiment, the printed circuit board includes at least seven circuit layers. In one embodiment, the printed circuit board includes at least eight circuit layers.

In addition, the printed circuit board according to one embodiment of the present invention includes a plurality of substrates, each of the plurality of substrates being interposed between one and a corresponding one of the plurality of circuit layers.

A method of laminating a plurality of circuit layers of a printed circuit board using a single lamination cycle or process is described in more detail in copending patent application Ser. No. 11/706,473, entitled Printed Circuit Boards With Stacked Micros Vias, filed on Feb. 14, 2007, and assigned to the assignee of the present application, the entire contents of which are incorporated herein by reference.

Figure 3:
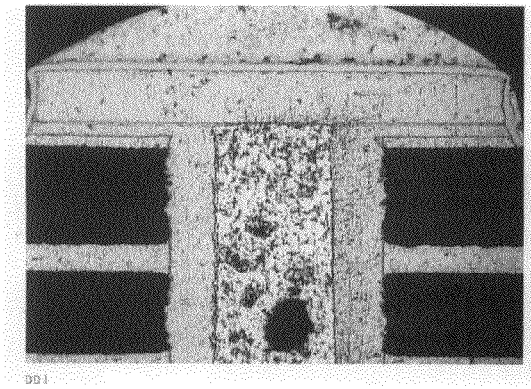
FIGS. 3 and 4 are views showing a wraparound copper wrapping over outer surface copper (e.g., the copper foil) does help to reduce the occurrence of surface conductor separation from holes with barrel-plated copper but increases the surface copper thickness, which makes it difficult to manufacture some tight geometry designs.
Figure 4:
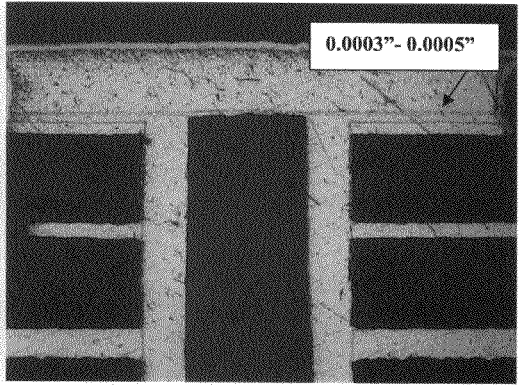
Figure 5:
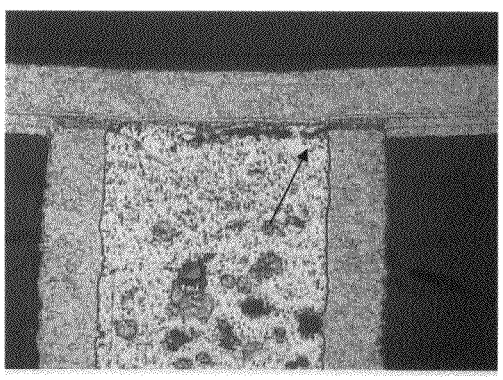
FIGS. 5 and 6 are views showing a lower wraparound plating thickness does not completely eliminate the occurrences of surface conductor separation from the plated hole wall copper. Lower wrap plate is normally chosen because of tighter designs and geometries.
Figure 6:
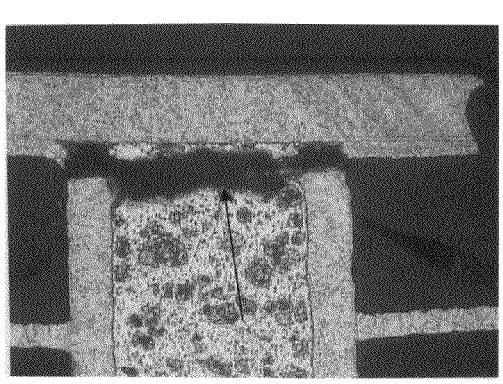

In one example, manufacturing process steps after a lamination operation having a wraparound plating thickness are as followed:
1. Drill;
2. Electroless Copper;
3. Panel Plate (0.0004"-0.0008")—for wraparound copper;
4. Clean/Re-Electroless Copper;
5. Resist Coat;
6. Photo (Dot Pattern) for Through-Holes;
7. Barrel Plate—To final customer plating thickness requirements;
8. Resist Strip;
9. Via Fill—Conductive or Non-Conductive;
10. Planarize—With care to minimize wraparound plate reduction;
11. Electroless Copper—to metalize the cap;
12. Resist Coat;
13. Photo—Image Conductor Pattern;
14. Plate Image;
15. Resist Strip;
16. Etch An embodiment of the present invention eliminates the need for wraparound copper as shown in FIGS. 3 and 4 and in the above described example to try to hold in place the bond between the surface conductor copper and the barrel plated copper.

Figure 7A:
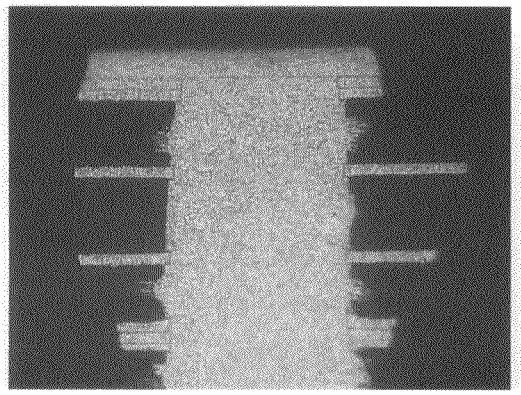
FIGS. 7A and 7B are views showing embodiments of copper plated and/or filled through-holes with no thermal stress.
Figure 7B:
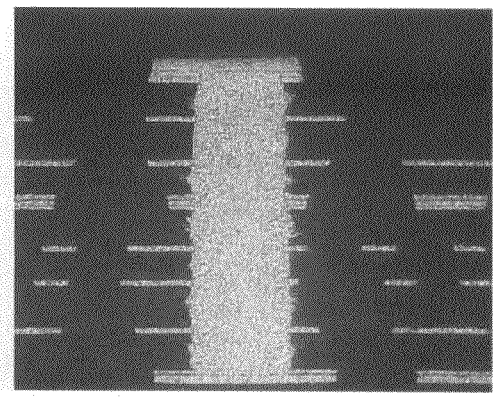

Referring to FIGS. 7A and 7B, one embodiment of the present invention provides one or more plate-closed through-holes. In one embodiment, the plate-closed through-holes are formed with electrolytic copper plating. A surface conductor (or cap) is then directly plated over the copper filled barrel plated through-hole (e.g., the cap is plated over the copper plug of the through-hole). In more detail, FIGS. 7A and 7B show copper filled through-holes (no wrap-around) prior to being thermal stressed (no thermal stress).

Figure 8A:
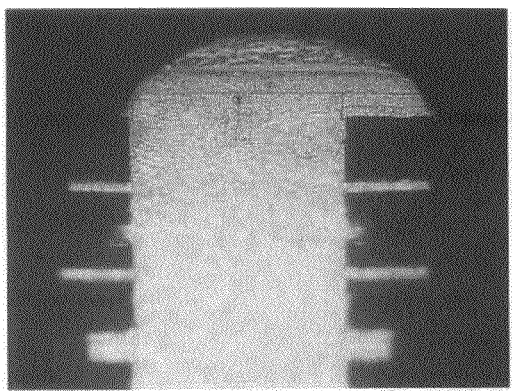
FIGS. 8A and 8B are views showing embodiments of copper plated and/or filled through-holes with 5× thermal stress at 550° F. (Per IPC-TM-650 Test Method 2.6.8).
Figure 8B:
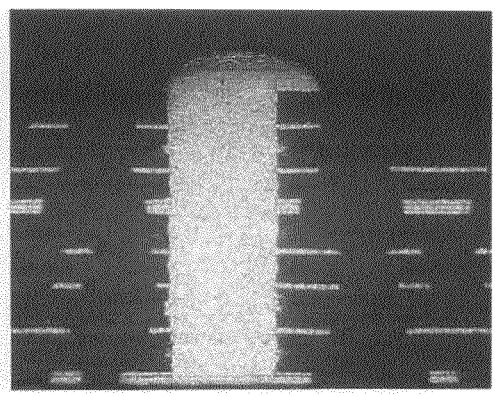

Because of the direct plating over a larger surface area of the copper plated hole, the surface conductor does not separate from the copper filled through-hole even under extreme thermal stress conditions (T joint). That is, FIGS. 8A and 8B show copper filled through-holes after being thermal stressed (5× thermal stress). As can be seen in FIGS. 8A and 8B, the copper filled through-holes do not exhibit any deterioration in the copper cap bond to the plated copper plug.

Figure 18:
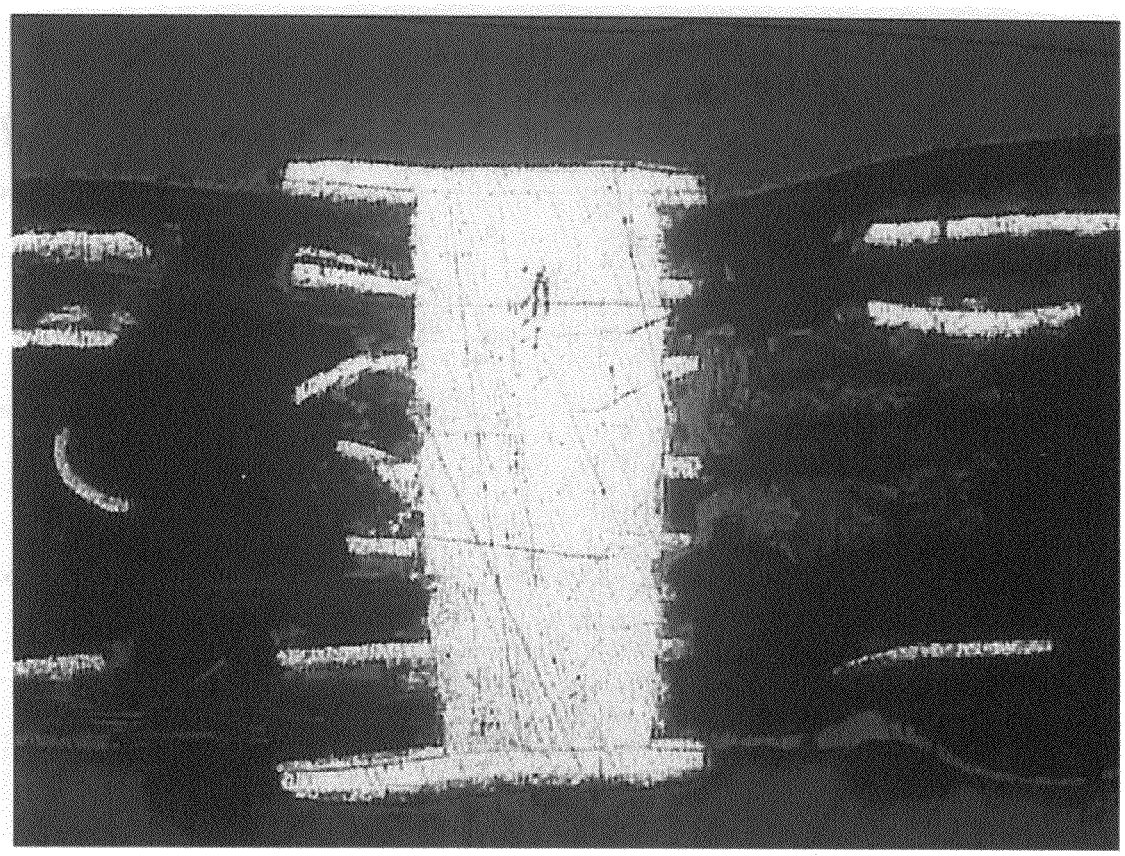
FIG. 18 is a view showing an embodiment of a copper plated and/or filled through-hole with extreme thermal stress.

FIG. 18 shows a copper filled through-hole that was under an extreme thermal stress condition. As can be seen in FIG. 18, even though other parts of the circuit broad (e.g., the circuit cores, substrates, carriers, circuitries, etc.) have been completely damaged and/or destroyed by the extreme thermal stress condition, the copper filled through-hole remains intact and/or does not exhibit any deterioration in the copper cap bond to the plated copper plug.

A reason why there is no deterioration in copper cap bond to plated copper plug is because embodiments of the present invention maximize (or increase) the contact surface area between the surface conductor and the copper plug. That is, as shown in FIGS. 9, 10, and 11, the best possible bonding between two conductors is when copper to copper is connected with each other.

In more detail, FIGS. 9 and 10 show a much smaller copper-to-copper contact bond area than is provided by the copper-to-copper bond area of FIG. 11. That is, FIGS. 9 and 10 are examples of the surface copper contact bond area having through-holes plated with minimum required copper thickness and filled with conductive (FIG. 9) and non-conductive (FIG. 10) materials, and FIG. 11 is an embodiment of the present invention. Here, the embodiment of FIG. 11 greatly increases the copper-to-copper surface contact bond area when compared with the examples of FIGS. 9 and 10 as shown by the arrows in FIGS. 9 and 10.

Figure 12:
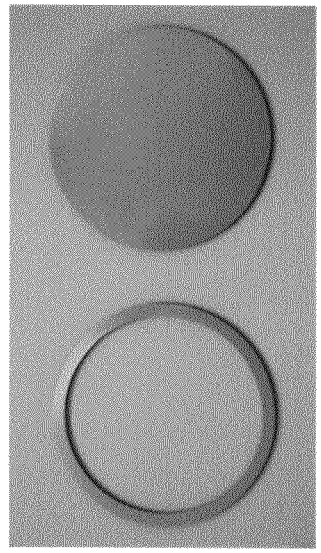
FIG. 12 is a view showing a sample model that compares a simulated 0.010" copper filled hole with a regular plated hole wall of a 0.001".

Referring to FIG. 12, the increase in copper-to-copper surface area can vary for different plated through-hole sizes. FIG. 12 show a sample model that compares a simulated 0.010" copper filled hole with a regular plated hole wall thickness of 0.001". Also, refer to the following table for other calculated examples that illustrate the envisioned examples of the present invention with copper filled holes in more detail and compare these envisioned copper filled hole examples with non-copper filled hole (Regular) examples (e.g., to highlight the benefit of the envisioned examples). However, the present invention is not limited by these envisioned examples.

Surface Contact/Bond Area Comparison

| | | Square Mils | | | |
|---|---|---|---|---|---|
| Hole Size | Regular Plated Copper | Regular Bond Area | Copper filled Bond Area | Improved Surface Area | Times Better |
| 0.006" | 0.001" | 15.7 | 28.3 | 12.6 | 1.8 |
| 0.008" | 0.001" | 22.0 | 50.3 | 28.3 | 2.3 |
| 0.010" | 0.001" | 28.3 | 78.5 | 50.2 | 2.8 |
| 0.015" | 0.001" | 44.0 | 176.5 | 132.5 | 4.0 |
| 0.020" | 0.001" | 59.7 | 314.1 | 254.4 | 5.3 |
| 0.025" | 0.001" | 75.4 | 490.7 | 415.3 | 6.5 |
| 0.030" | 0.001" | 91.1 | 706.8 | 615.7 | 7.8 |

In view of the foregoing, embodiments of the present invention not only provide a much better direct bonding, but also standardize the Coefficient of Thermal Expansion (CTE) between the same (or substantially the same) plated materials. That is, instead of having the different CTE values between the plated copper cap and the other industry used hole filled materials, the CTE for the pure (or substantially pure) plated copper cap and the copper plated plug according to an embodiment of the present invention is the same (or substantially the same).

Figure 1B:
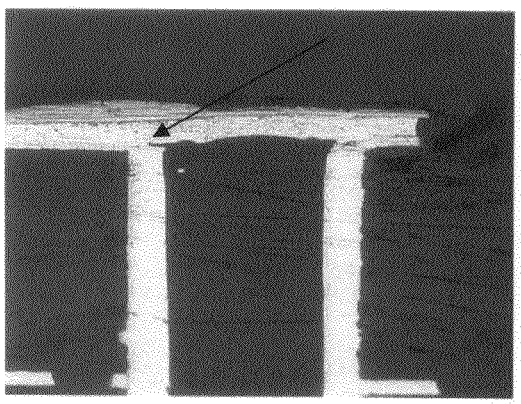
Figure 2A:
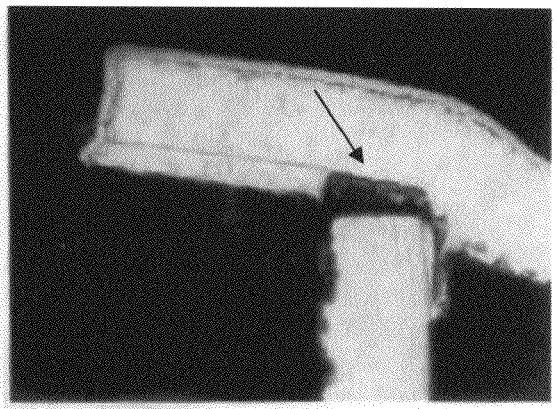
Figure 2B:
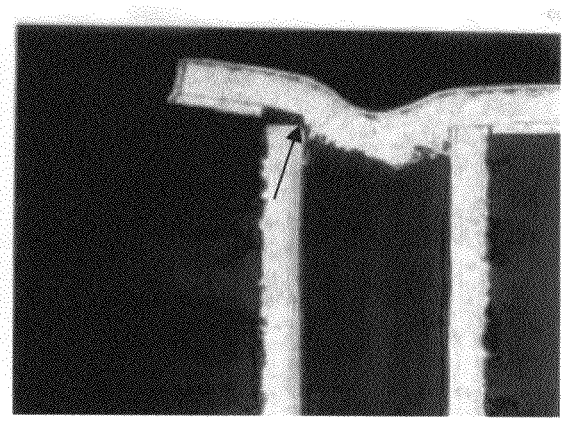
Figure 13:
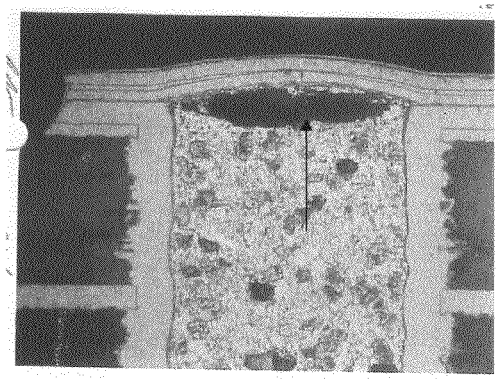
FIG. 13 is a view showing a condition leading to excessive expansion of a via fill plug creating a voided area that causes a "cap to via fill separation."
Figure 14:
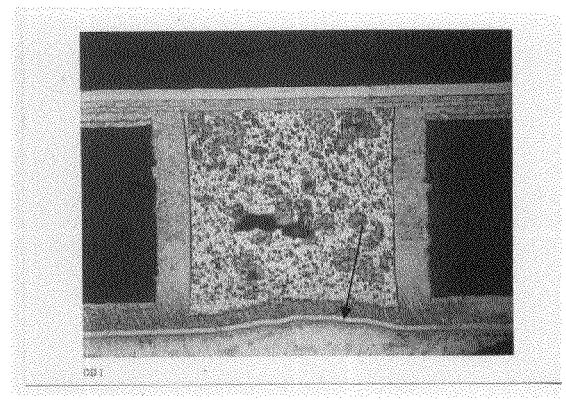
FIG. 14 is a view showing a contracted dish down surface characteristic of via fill materials.

Embodiments of the present invention can also eliminate (or reduce the effect) of the following issues:

1. Reduction of space between conductors on jobs that use the wraparound process.
2. The sporadic separation of the plated cap from the via fill materials (Conductive or Non-conductive). This is primarily caused by the entrapped volatile organic compounds (VOCs) from the via fill materials during their bake curing cycle and/or CTE differences between plated copper cap and the via fill material used. This condition leads to excessive expansion of the via fill plug, creating a voided area that causes the "cap to via fill separation" as shown by the arrow in FIG. 13. This condition may cause the printed circuit board to be scrapped.
3. The typical contracted dish down surface characteristic of the other via fill materials as shown by the arrow in FIG. 14 by providing a more "flatter" surface.
4. The typical separation of the T joints as shown in FIGS. 1 and 2 on products without the wraparound process.

Figure 15:
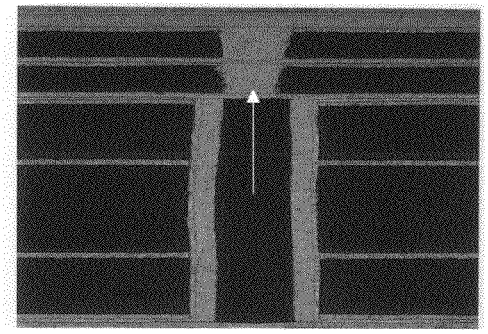
FIG. 15 is a view showing laser microvia embodiment with a thin copper plated cap over non-conductive ink filled hole.
Figure 16:
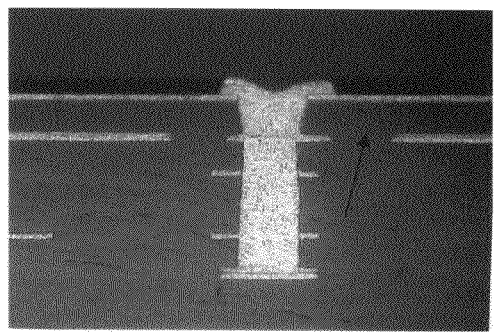
FIG. 16 is a view showing laser microvia embodiment with surface landing area having improved strength.
Figure 17:
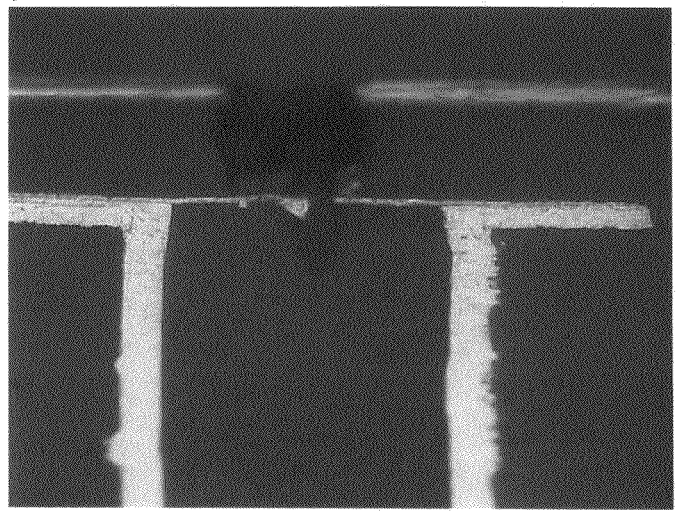
FIG. 17 is a view showing a blow through by laser during laser microvia drilling of the thin surface-landing pad of FIG. 15.

In addition, embodiments of the present invention provide:
1. Improved thermal conductivity due to the fact that solid copper plugs are a better heat conductor than other via fill materials.
2. Improved electrical continuity contacts on partially registered through-holes (within IPC requirements as described above).
3. Consistent impedance values on the plated layers with copper filled holes. This is because of the minimum copper and more even surface plated distribution obtained by the embodiments of the present invention.
4. Improved dielectric thickness on all sub-laminations between the sub-outer plated layer and the subsequent laminated layer.
5. Improved landing pad for laser microvias. When compared to the thin surface landing area for laser microvias over non-conductive material filled hole in FIG. 15, the current idea provides an improved surface landing area for laser microvias (FIG. 16). The thin surface-landing pad (FIG. 15) is susceptible to blow-through by laser during laser microvia drilling (FIG. 17).

In one embodiment of the present invention, manufacturing process steps after lamination are as followed:
1. Drill;
2. Electroless Copper;
3. Resist Coat (or applying a resist);
4. Photo (Dot Pattern) for through-holes;
5. Barrel Plate (Special Plating Cycle) to plate close the through-holes;
6. Resist Strip (or remove a resist);
7. Planarize Barrel plate image down to the level of the base copper;
8. Clean/Re-Electroless Copper for better resist adhesion;
9. Resist Coat (or apply a resist);
10. Photo—Image;
11. Plate—Image;
12. Resist Strip (or remove a resist);
13. Etch.

In one embodiment, the electroless copper (or electroless coppering) includes four basic operations: cleaning, activation, acceleration, and deposition. In addition, an anti-tarnish bath may also be performed after deposition.

In more detail, the cleaning operation begins with a cleaner-conditioner designed to remove organics and condition a plurality of circuit layers (or a circuit board) with one or more through-holes for the subsequent uptake of catalyst. The cleaner-conditioners may include an acidic or alkaline solution.

The activation and acceleration operations may be performed through the use of a catalyst and two process tanks. That is, a pre-dip tank is used for the drag-in protection of the activation or catalyst bath, and usually contains hydrochloric acid and possibly tin or sodium chloride. The activation or catalyst bath includes hydrochloric acid, tin chloride, and/or a palladium chloride. The Sn+2 ion reduces the Pd+2 to Pd, which is deposited on the plurality of circuit layers with the one or more through-holes. The remaining Sn+2 and Sn+4 are selectively removed by the accelerator (also called the post-activator). Suitable accelerators include fluoboric acid and/or sulfuric acid with hydrazine.

The main constituents of the electroless copper chemistry are sodium hydroxide, formaldehyde, EDTA (or other chelater), and a copper salt. In the complex reaction, catalyzed by palladium, formaldehyde reduces the copper ion to metallic copper.

In one embodiment, the barrel plate (or plating) is a electrolytic copper plating process based on positively charged conductivity and reactions of the plating metals (i.e., copper) and electrons.

In one embodiment, the process of the copper plating process is composed of four important parts:
1. Cathode—the negative electrode in electrolysis, where negative electrons are created and positive ions are discharged; it is the object (i.e., the circuit board) that is going to be plated;
2. Anode—positive electrode in the electrolysis, where negative ion are discharged and positive ions are created; it is of the same material as the plating metal;
3. Electrolyte—conducting medium where the flow of current is with the movement of matter (e.g., aqueous solutions such as acids, bases and salts);
4. Direct current—the electricity that passes from the anode to the cathode.

Here, in the plating process, as the direct current passes from the anode through the electrolyte, it brings positive ions of the plating metal to the cathode. It is then joined with negative electrons created by the cathode and transforms into the metal coating. The metal coating bonds to the cathode and thus the electroplating process is complete.

Figure 19:
FIG. 19 is a flow chart for illustrating a method of manufacturing a printed circuit board having a plurality of circuit layers with one or more through-holes to connect copper patterns on different layers of the printed circuit board.

In one embodiment of the present invention and referring to FIG. 19, a printed circuit board having a plurality of circuit layers with one or more through-holes to connect copper patterns on different layers of the printed circuit board is manufactured by first laminating the plurality of circuit layers with each other to form the circuit board with a first solid copper layer and a second solid copper layer respectively as both outermost layers of the circuit board (Lamination). The one or more through-holes are then drilled into the laminated circuit layers (Drill). The drilled circuit layers with the one or more through-holes are then metalized or, more specifically, electroless coppered (Electroless Cu Plate). A resist (e.g. a photo resist) is then coated on both outermost layers of the circuit layers, and the resist on the circuit layers is patterned to expose the one or more through-holes to an electrolytic plating solution (Outer Layer Imaging). The one or more through-holes are then copper plated with the electrolytic plating solution to plate close the one or more through-holes (Cu Barrel Plate) and as described above in more detail. The resist is then removed or striped, and excess copper plated on both outermost layers of the circuit layers is then planarized. Then, one or more conductive caps are formed to cover the one or more copper filled through-holes on one or both outermost layers of the circuit layers to form the printed circuit board having the plurality of circuit layers with the one or more copper filled through-holes.

In one embodiment of the present invention, a conductive cap is formed to cover a copper filled through-hole by first cleaning/electroless coppering the planarized circuit layers. Then, a second resist (e.g., a second photo resist) is coated on both outermost layers of the circuit layers with the one or more copper filled through-holes. The second resist on at least one outermost layer of the circuit layers is then patterned to image the conductive cap on the copper filled through-hole. The conductive cap is then directly copper plated over the copper filled through-hole, and the second resist is removed or stripped. Then, an outer layer of the plurality of circuit layers with the one or more copper filled through-holes are etched (Outer Layer Etch) to connect copper patterns on different layers of the printed circuit board to realize the printed circuit board having the plurality of circuit layers with the one or more copper filled through-holes.

The present invention, however, is not limited by the method as described above. As an example in another embodiment of the present invention and still referring to FIG. 19, a method of manufacturing a printed circuit board having a plurality of circuit layers with at least one through-hole to connect copper patterns on different layers of the printed circuit board is provided. The method includes: drilling at least one through-hole into a laminated structure with a first solid copper layer and a second solid copper layer respectively as both outermost layers of the laminated structure; metalizing the drilled circuit layers with the at least one through-hole; applying a resist on both outermost layers of the laminated structure; patterning the resist on both outermost layers of the laminated structure to expose the at least one through-hole to an electrolytic plating solution; electrolytic copper plating the at least one through-hole with the electrolytic plating solution to plate close the at least one through-hole; removing the resist; planarizing excess copper plated on both outermost layers of the laminated structure; and forming a conductive cap on one or both outermost layers of the laminated structure to cover the copper filled through-hole.

While the invention has been described in connection with certain exemplary embodiments, it is to be understood by those skilled in the art that the invention is not limited to the disclosed embodiments, but, on the contrary, is intended to cover various modifications included within the spirit and scope of the present invention, and equivalents thereof.

What is claimed is:
1. A method of manufacturing a printed circuit board having a plurality of circuit layers with at least one through-hole to connect copper patterns on different layers of the printed circuit board, the method comprising:
   drilling at least one through-hole into a laminated structure with a first solid copper layer and a second solid copper layer respectively as both outermost layers of the laminated structure;
   metalizing the drilled circuit layers with the at least one through-hole;
   applying a resist on both outermost layers of the circuit layers;

patterning the resist on both outermost layers of the circuit layers to expose the at least one through-hole to an electrolytic plating solution;

electrolytic copper plating the at least one through-hole with the electrolytic plating solution to fill close the at least one through-hole with copper;

removing the resist;

planarizing excess copper plated on both outermost layers of the circuit layers to expose both outermost layers of the circuit layers;

cleaning the planarized circuit layers with the copper filled through holes;

applying a second resist on at least one outermost layer of the outermost layers with the copper filled through-hole;

patterning the second resist on the at least one outermost layer to image a conductive cap on the copper filled through-hole; and plating copper directly on the copper filled through-hole to form the conductive cap.

2. A method of manufacturing a printed circuit board having a plurality of circuit layers with at least one through-hole to connect copper patterns on different layers of the printed circuit board, the method comprising:

laminating the plurality of circuit layers with each other to form the circuit board with a first solid copper layer and a second solid copper layer respectively as both outermost layers of the circuit board;

drilling at least one through-hole into the laminated circuit layers;

metalizing the drilled circuit layers with the at least one through-hole;

applying a resist on both outermost layers of the circuit layers;

patterning the resist on both outermost layers of the circuit layers to expose the at least one through-hole to an electrolytic plating solution;

electrolytic copper plating the at least one through-hole with the electrolytic plating solution to fill close the at least one through-hole with copper;

removing the resist;

planarizing excess copper plated on both outermost layers of the circuit layers to expose both outermost layers of the circuit layers;

cleaning the planarized circuit layers with the copper filled through holes;

applying a second resist on at least one outermost layer of the circuit layers with the copper filled through-hole;

patterning the second resist on the at least one outermost layer of the circuit layers to image a conductive cap on the copper filled through-hole; and plating copper directly on the copper filled through-hole to form the conductive cap.

3. The method of claim 2, wherein the at least one through-hole is formed by mechanical drilling.

4. The method claim 2, wherein the applying the second resist comprises applying the second resist on both outermost layers of the circuit layers with the copper filled through-hole; and the method further comprising: etching the at least one outermost layer of the circuit layers to form the circuit board.

5. The method of claim 2, wherein the conductor cap is formed to directly plate on the copper filled through-hole at each end of the copper filled through-hole.

6. The method of claim 2, wherein the copper plating the at least one through-hole with the electrolytic plating solution to plate close the at least one through-hole comprises barrel plating the at least one through-hole with the electrolytic plating solution to plate close the at least one through-hole.

7. The method of claim 2, wherein the copper plating the at least one through-hole with the electrolytic plating solution to plate close the at least one through-hole comprises plating the at least one through-hole with at least 70% volume of the at least one though-hole with copper.

8. The method of claim 2, wherein the copper plating the at least one through-hole with the electrolytic plating solution to plate close the at least one through-hole comprises plating the at least one through-hole with enough electrolytic plated copper to plate close both ends of the at least one through-hole.

9. The method of claim 2, wherein the copper plating the at least one through-hole with the electrolytic plating solution to plate close the at least one through-hole comprises enhancing a thermal characteristic of the at least one through-hole.

* * * * *